(12) United States Patent
Odaka

(10) Patent No.: US 11,963,380 B2
(45) Date of Patent: Apr. 16, 2024

(54) DISPLAY DEVICE INCLUDING AN ADHESIVE BONDED POLARIZATION PLATE

(71) Applicant: Japan Display Inc., Tokyo (JP)

(72) Inventor: Kazuhiro Odaka, Tokyo (JP)

(73) Assignee: JAPAN DISPLAY INC., Tokyo (JP)

(*) Notice: Subject to any disclaimer, the term of this patent is extended or adjusted under 35 U.S.C. 154(b) by 0 days.

(21) Appl. No.: 17/888,486

(22) Filed: Aug. 16, 2022

(65) Prior Publication Data
US 2022/0393134 A1    Dec. 8, 2022

Related U.S. Application Data

(63) Continuation of application No. 16/997,968, filed on Aug. 20, 2020, now Pat. No. 11,450,834, which is a (Continued)

(30) Foreign Application Priority Data

Feb. 27, 2018   (JP) ................. 2018-033010

(51) Int. Cl.
*H10K 50/81*    (2023.01)
*H10K 50/80*    (2023.01)
(Continued)

(52) U.S. Cl.
CPC ....... *H10K 50/8426* (2023.02); *H10K 50/844* (2023.02); *H10K 50/868* (2023.02);
(Continued)

(58) Field of Classification Search
CPC ............ H10K 50/8426; H10K 50/844; H10K 50/868; H10K 50/11; H10K 50/86;
(Continued)

(56) References Cited

U.S. PATENT DOCUMENTS 10,283,574 B2 * 5/2019 Kim ................ G06F 3/0412
10,522,608 B2 12/2019 Park et al.
(Continued)

FOREIGN PATENT DOCUMENTS

CN   106601781 A  *  4/2017  ......... H01L 27/3246
CN   107464828 A  * 12/2017  ......... H01L 27/3244
(Continued)

OTHER PUBLICATIONS

Office Action dated Nov. 29, 2022 in Japanese Patent Application No. 2022-026956, 8 pages.
(Continued)

*Primary Examiner* — Ida M Soward
(74) *Attorney, Agent, or Firm* — XSENSUS LLP

(57) ABSTRACT

A display device includes: multiple layers including a display element layer, the multiple layers including a sealing layer for covering the display element layer; and a polarization plate attached to a first layer and a second layer of the multiple layers with an adhesive layer. The multiple layers includes inorganic films and organic films. All of the inorganic films are disposed to avoid an edge area that is at least a part of a peripheral portion of the resin substrate. The polarization plate has an edge above the edge area of the resin substrate. The first layer is disposed to avoid the edge area of the resin substrate. The first layer at an edge has an upper surface sloping downward toward the edge area. The second layer has a portion in the edge area of the resin substrate and between the resin substrate and the adhesive layer.

8 Claims, 19 Drawing Sheets

Related U.S. Application Data continuation of application No. PCT/JP2018/042812, filed on Nov. 20, 2018.

(51) Int. Cl.

| | | |
|---|---|---|
| *H10K 50/84* | (2023.01) | |
| *H10K 50/842* | (2023.01) | |
| *H10K 50/844* | (2023.01) | |
| *H10K 50/86* | (2023.01) | |
| *H10K 59/12* | (2023.01) | |
| G02F 1/1335 | (2006.01) | |
| G06F 1/16 | (2006.01) | |
| G09F 9/30 | (2006.01) | |
| H10K 50/11 | (2023.01) | |
| H10K 50/115 | (2023.01) | |
| H10K 50/818 | (2023.01) | |
| H10K 59/121 | (2023.01) | |
| H10K 102/00 | (2023.01) | |

(52) U.S. Cl.
CPC ...... *G02F 1/133528* (2013.01); *G06F 1/1652* (2013.01); *G09F 9/301* (2013.01); *G09G 2380/02* (2013.01); *H10K 50/11* (2023.02); *H10K 50/115* (2023.02); *H10K 50/818* (2023.02); *H10K 59/12* (2023.02); *H10K 59/1216* (2023.02); *H10K 2102/00* (2023.02)

(58) Field of Classification Search
CPC .. H10K 50/8445; H10K 59/00; H10K 77/111; H10K 2102/00; H10K 2102/311; H10K 2102/351; H10K 50/115; H10K 50/818; H10K 59/12; H10K 59/1216; H05B 33/02; H05B 33/04; H05B 33/12; H05B 33/22; G09F 1/133528; G09F 9/00; G09F 1/1652; G09F 9/301; G09G 2380/02
See application file for complete search history.

(56) References Cited

U.S. PATENT DOCUMENTS

| | | |
|---|---|---|
| 11,081,665 B2 | 8/2021 | Nakagawa |
| 2013/0120227 A1 | 5/2013 | Tanikawa |
| 2015/0280172 A1 | 10/2015 | Nishinohara et al. |
| 2016/0049608 A1* | 2/2016 | Hack ................ H10K 50/13 438/46 |
| 2016/0124259 A1 | 5/2016 | Kawata |
| 2016/0293884 A1* | 10/2016 | Zhang ................ H10K 71/00 |
| 2017/0069692 A1* | 3/2017 | Lee ................ H10K 59/40 |
| 2017/0237025 A1 | 8/2017 | Choi et al. |
| 2017/0250374 A1 | 8/2017 | Tokuda |
| 2017/0288004 A1* | 10/2017 | Kim ................ H10K 77/10 |
| 2017/0294621 A1 | 10/2017 | Higano et al. |
| 2017/0301955 A1* | 10/2017 | Kwak ................ C23C 14/34 |
| 2017/0338441 A1 | 11/2017 | Higano |
| 2017/0365813 A1* | 12/2017 | Kamiya ................ G06F 3/0412 |
| 2018/0033829 A1* | 2/2018 | Oh ................ H10K 59/122 |
| 2018/0039360 A1 | 2/2018 | Akimoto et al. |
| 2018/0122890 A1* | 5/2018 | Park ................ H10K 59/1315 |
| 2018/0124933 A1* | 5/2018 | Park ................ H10K 59/00 |
| 2018/0151837 A1 | 5/2018 | Furuie |
| 2018/0151838 A1* | 5/2018 | Park ................ G06F 3/0412 |
| 2018/0158894 A1* | 6/2018 | Park ................ H10K 71/70 |
| 2018/0182818 A1* | 6/2018 | Kim ................ H10K 59/40 |
| 2018/0183003 A1* | 6/2018 | Han ................ H01L 27/1255 |
| 2018/0197924 A1 | 7/2018 | Tada et al. |
| 2018/0308903 A1* | 10/2018 | Jeong ................ G06F 3/0443 |
| 2019/0096975 A1* | 3/2019 | Park ................ H10K 59/131 |
| 2019/0334105 A1 | 10/2019 | Choi et al. |
| 2019/0348476 A1 | 11/2019 | Kato |
| 2020/0142530 A1* | 5/2020 | Lee ................ G06F 3/0443 |
| 2021/0036246 A1 | 2/2021 | Fujiwara |
| 2021/0103352 A1* | 4/2021 | Lee ................ H10K 50/844 |
| 2021/0119180 A1* | 4/2021 | Wang ................ H10K 71/00 |

FOREIGN PATENT DOCUMENTS

| | | | | |
|---|---|---|---|---|
| EP | 3276460 A1 * | 1/2018 | ........... | G06F 3/0412 |
| JP | 2009054370 A * | 3/2009 | ............. | H05B 33/22 |
| JP | 2011138669 A * | 7/2011 | ......... | H04L 27/3244 |
| JP | 2013-105144 A | 5/2013 | | |
| JP | 2017-152252 A | 8/2017 | | |
| JP | 2017-211420 A | 11/2017 | | |
| JP | 2018-022322 A | 2/2018 | | |

OTHER PUBLICATIONS

International Search Report and Written Opinion dated Feb. 19, 2019 for PCT/JP2018/042812 filed on Nov. 20, 2018, 9 pages.

* cited by examiner

DISPLAY DEVICE INCLUDING AN ADHESIVE BONDED POLARIZATION PLATE

CROSS-REFERENCE TO RELATED APPLICATION

This application is a continuation of U.S. application Ser. No. 16/997,968, filed Aug. 20, 2020, which is a continuation application of International Application PCT/JP2018/042812 filed on Nov. 20, 2018, which claims priority from Japanese patent application JP2018-033010 filed on Feb. 27, 2018. The contents of these applications are incorporated herein by reference in their entirety.

BACKGROUND

1. Field

This relates to a display device.

2. Description of the Related Art

A bendable display panel has been developed (JP 2017-211420A). Such a display panel uses a resin substrate, and an inorganic film is laminated on the resin substrate for barrier to impurities. An organic electroluminescence display device, due to vulnerability to moisture, has display elements covered with a sealing film (JP 2013-105144A). To improve moisture barrier properties, a sealing film, with a structure in which an organic film is interposed above and below a pair of inorganic films, is known. The pair of inorganic films are in contact with each other at a periphery of the sealing film. A polarization plate is attached to the sealing film for preventing external light reflection (JP 2017-152252A).

Cracking in the inorganic film may leads to moisture intrusion at the periphery of the display panel. Thus, the inorganic film should be removed at the periphery of the display panel. Removing the inorganic film leaves unevenness on the periphery. After attaching a polarization plate larger in size than the display panel, for example, and finally cutting it by a laser, bubbles are generated under the polarization plate, accelerating separation of the polarization plate.

SUMMARY

This aims at preventing separation of a polarization plate.

A display device includes: a resin substrate; multiple layers laminated on the resin substrate, the multiple layers including a display element layer for displaying images, the multiple layers including a sealing layer for covering the display element layer; and a polarization plate attached to a first layer and a second layer of the multiple layers with an adhesive layer. The multiple layers include some inorganic films and some organic films. All of the inorganic films are disposed to avoid an edge area that is at least a part of a peripheral portion of the resin substrate. The polarization plate has an edge above the edge area of the resin substrate. The first layer is disposed to avoid the edge area of the resin substrate. The first layer at an edge has an upper surface sloping downward toward the edge area. The second layer has a portion in the edge area of the resin substrate and between the resin substrate and the adhesive layer.

Thus, all of the inorganic films avoid the edge area of the resin substrate. The second layer intervenes between the resin substrate and the adhesive layer and in the edge area, leading to small unevenness, preventing separation of the polarization plate.

DETAILED DESCRIPTION

Figure 1:
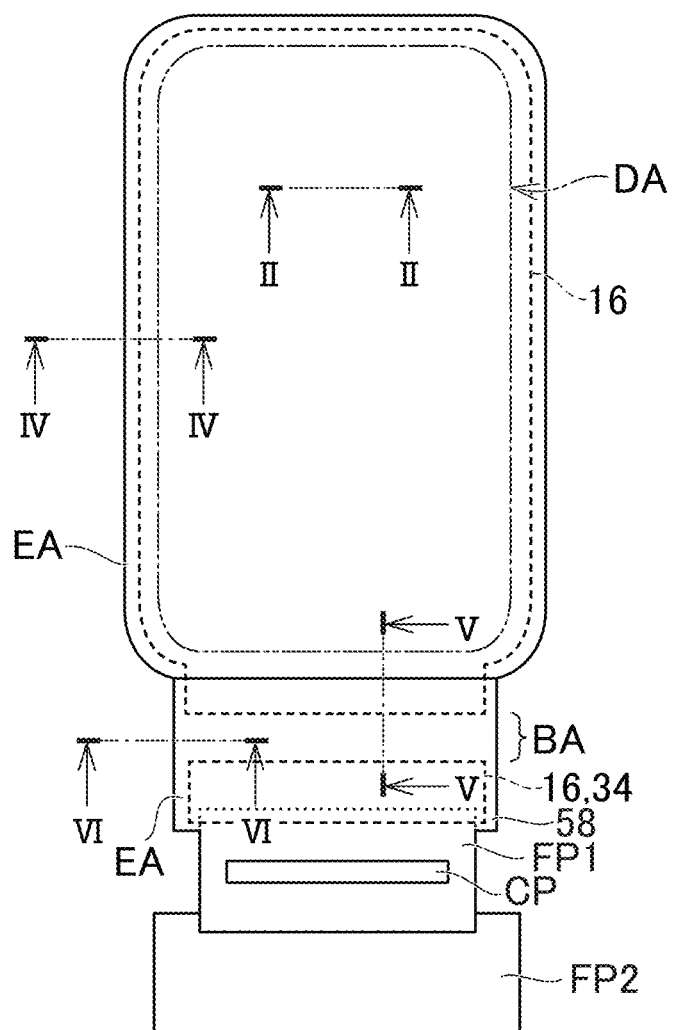
FIG. 1 is a plan view of a display device in a first embodiment.

Hereinafter, some embodiments will be described with reference to the drawings. Here, the invention can be embodied according to various aspects within the scope of the invention without departing from the gist of the invention and is not construed as being limited to the content described in the embodiments exemplified below.

The drawings are further schematically illustrated in widths, thickness, shapes, and the like of units than actual forms to further clarify description in some cases but are merely examples and do not limit interpretation of the invention. In the present specification and the drawings, the same reference numerals are given to elements having the same functions described in the previously described drawings and the repeated description will be omitted.

Figure 18:
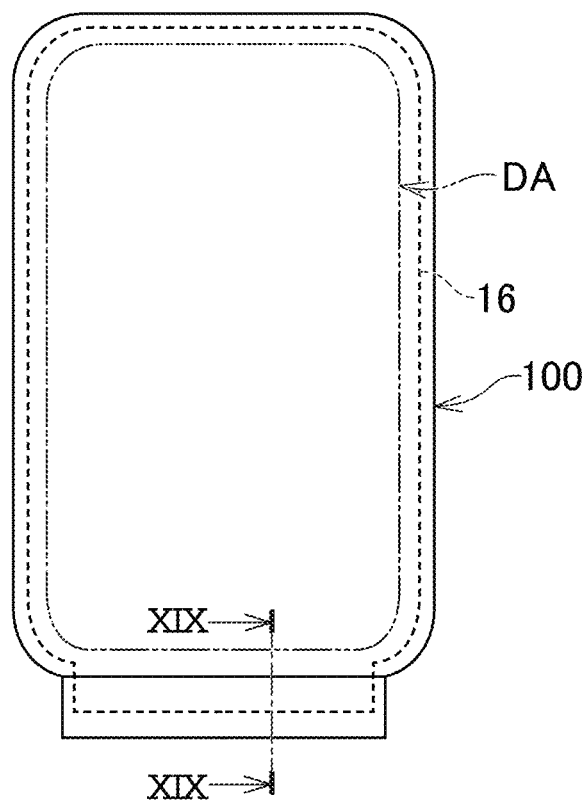
FIG. 18 is a schematic view of usage of the display device.
Figure 19:
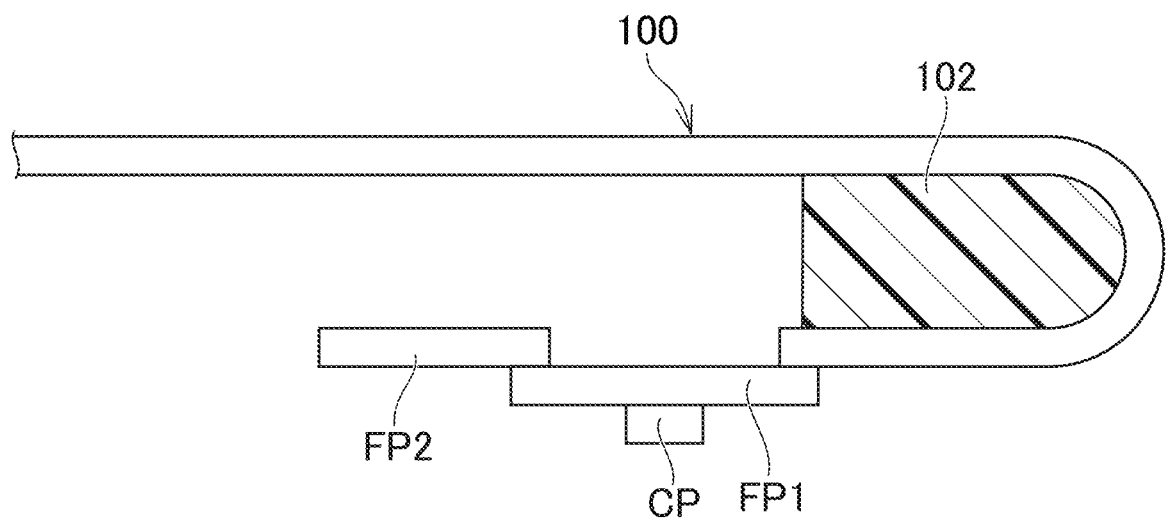
FIG. 19 is a XIX-XIX line schematic cross sectional view of the display device in FIG. 18.

Further, in the detailed description, "on" or "under" in definition of positional relations of certain constituents and other constituents includes not only a case in which a constituent is located just on or just under a certain constituent but also a case in which another constituent is interposed between constituents unless otherwise mentioned.

First Embodiment FIG. 1 is a plan view of a display device in a first embodiment. The display device is actually folded to be used. FIG. 1 is a developed view of the display device before it is folded. FIG. 18 is a schematic view of usage of the display device. FIG. 19 is a XIX-XIX line schematic cross sectional view of the display device in FIG. 18. The display device includes a display 100. There is a spacer 102 inside curvature, preventing the display 100 from being bent too much. The display 100 has flexibility and is folded outside a display area DA. A first flexible printed circuit board FP1 is connected to the display 100 outside the display area DA. An integrated circuit chip CP is mounted on the first flexible printed circuit board FP1 for driving image displaying elements. A second flexible printed circuit board FP2 is connected to the first flexible printed circuit board FP1.

The display device may be an organic electroluminescence display device. The display device has the display area DA for displaying images. The display area DA displays a full-color image by forming full-color pixels, each of which consist of unit pixels (subpixels) in some colors such as red, green, and blue.

Figure 2:
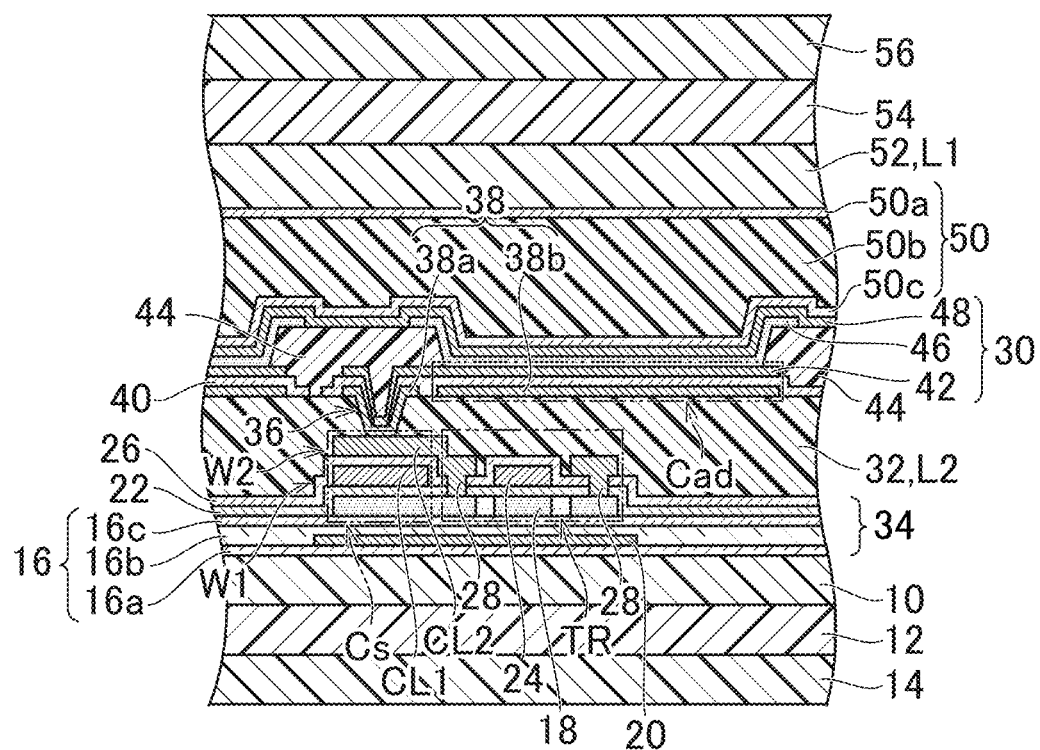
FIG. 2 is a II-II line cross-sectional view of the display device in FIG. 1.

FIG. 2 is a II-II line cross-sectional view of the display device in FIG. 1. A resin substrate 10 is formed from polyimide. Or, other resin materials can be used as long as the materials have satisfactory flexibility for a sheet display or a flexible display. A reinforcement film 14 is attached to a back of the resin substrate 10 with a pressure sensitive adhesive 12.

A barrier inorganic film 16 (undercoat layer) is laminated on the resin substrate 10. The barrier inorganic film 16 has a three-layer laminated structure of a silicon oxide film 16a, a silicon nitride film 16b, and a silicon oxide film 16c. The silicon oxide film 16a of the lowest layer is for improving close-fitting properties with the resin substrate 10; the silicon nitride film 16b of the middle layer is a blocking film from external moisture and impurities; the silicon oxide film 16c of the uppermost layer is for another blocking film to prevent hydrogen atoms in the silicon nitride film 16b from diffusing on a side of a semiconductor layer 18 of a thin film transistor TR, but such a structure is not essential and an additional laminate, a single layer, or a two-layer laminate is applicable thereto.

An additional film 20 may be formed in an area where the thin film transistor TR is formed. The additional film 20 may suppress characteristic change of the thin film transistor TR due to light intrusion from a channel back or may provide the thin film transistor TR with a backgating effect by being formed from conductive material to apply a certain potential. In the embodiment, after the silicon oxide film 16a is formed, the additional film 20 is formed in an island shape corresponding to the area where the thin film transistor TR is formed, and then the silicon nitride film 16b and the silicon oxide film 16c are laminated, whereby the additional film 20 is sealed in the barrier inorganic film 16; alternatively, the additional film 20 may be formed on the resin substrate 10, prior to forming the barrier inorganic film 16.

The thin film transistor TR is on the barrier inorganic film 16. A polysilicon thin film transistor is an example and only an N-ch transistor is herein illustrated, but a P-ch transistor may be simultaneously formed. The semiconductor layer 18 of the thin film transistor TR has a structure where a low concentration impurities area is provided between a channel area and a source/drain area. A silicon oxide film is herein used for a gate insulating film 22. A gate electrode 24 is a part of a first wiring layer W1 made from MoW. The first wiring layer W1 includes a first storage capacitor line CL1 in addition to the gate electrode 24. A part of a storage capacitor Cs is formed between the first storage capacitor line CL1 and the semiconductor layer 18 (source/drain area) with the gate insulating film 22 interposed therebetween.

There is an interlayer dielectric 26 (silicon oxide film, silicon nitride film) laminated on the gate electrode 24. A second wiring layer W2, which includes portions for a source/drain electrode 28, is on the interlayer dielectric 26. A three layers laminate structure of Ti, Al, and Ti is herein employed. The first storage capacitor line CL1 (part of the first wiring layer W1) and a second storage capacitor line CL2 (part of the second wiring layer W2) constitute another portion of the storage capacitor Cs, with the interlayer dielectric 26 interposed therebetween.

A flattening organic film 32 covers the source/drain electrode 28. Resin such photosensitive acrylic is used for the flattening organic film 32 because of superior surface flatness, compared with inorganic insulation material formed by chemical vapor deposition (CVD). Laminated inorganic films between the resin substrate 10 and the flattening organic film 32 constitute a circuit layer 34. The circuit layer 34 is connected to a display element layer 30 for displaying images.

The flattening organic film 32 is removed at a pixel contact portion 36 and has an indium tin oxide (ITO) film 38 formed thereon. The indium tin oxide film 38 includes a first transparent conductive film 38a and a second transparent conductive film 38b, which are separated from each other.

By removing the flattening organic film 32, the second wiring layer W2 has a surface exposed and is covered with the first transparent conductive film 38a. A silicon nitride film 40 is on the flattening organic film 32, covering the first transparent conductive film 38a. The silicon nitride film 40 has an opening at the pixel contact portion 36, whereby a pixel electrode 42 is laminated on and connected to the source/drain electrode 28 through the opening. The pixel electrode 42 is a reflective electrode and has a three-layer laminate structure of an indium zinc oxide film, an Ag film, and an indium zinc oxide film. The indium zinc oxide film may be herein replaced by an indium tin oxide film. The pixel electrode 42 extends laterally from the pixel contact portion 36 and to above the thin film transistor TR.

The second transparent conductive film 38b is adjacent to the pixel contact portion 36 and under the pixel electrode 42 (further below the silicon nitride film 40). The second transparent conductive film 38b, the silicon nitride film 40, and the pixel electrode 42 overlap with one another, thereby forming an additional capacitance Cad.

An insulation organic film 44, which is called a bank (rib) for a partition of adjacent pixel areas, is on the flattening organic film 32 and over the pixel contact portion 36, for example. Photosensitive acrylic may be used for the insulation organic film 44 just like the flattening organic film 32. The insulation organic film 44 has an opening for exposing a surface of the pixel electrode 42 as a light-emitting region, and the opening should have an edge in a gentle tapered shape. A steep shape of the opening may cause insufficient coverage of an organic electroluminescence layer 46 formed thereon.

The flattening organic film 32 and the insulation organic film 44 are in contact with each other through an opening in the silicon nitride film 40 between them. This makes it possible to remove moisture and gas desorbed from the flattening organic film 32 through the insulation organic film 44 during heat treatment after the insulation organic film 44 is formed.

The organic electroluminescence layer 46, made from organic materials, is laminate on the pixel electrode 42. The organic electroluminescence layer 46 may be a single layer or may be a structure where a hole transport layer, a light-emitting layer, and an electron transport layer are laminated in this order from the pixel electrode 42. These layers may be formed by vapor deposition or by application after solvent dispersion, may be selectively formed for the respective pixel electrodes 42 (respective sub-pixels), or may be formed all over the surface covering the display area DA. The overall formation results in a structure for emitting white light, from which desired color wavelength portion is extracted at every sub-pixel through a color filter (not shown).

There is a counter electrode 48 on the organic electroluminescence layer 46. Due to a top emission structure employed herein, the counter electrode 48 is transparent. A Mg layer and an Ag layer may be formed to be as thin a film as outgoing light from the organic electroluminescence layer 46 can pass. In comply with the forming order of the organic electroluminescence layer 46, the pixel electrode 42 is an anode, and the counter electrode 48 is a cathode. The plurality of pixel electrodes 42, the counter electrode 48, and the organic electroluminescence layer 46 between central portions of the respective pixel electrodes 42 and the counter electrode 48 constitute the display element layer 30.

Figure 4:
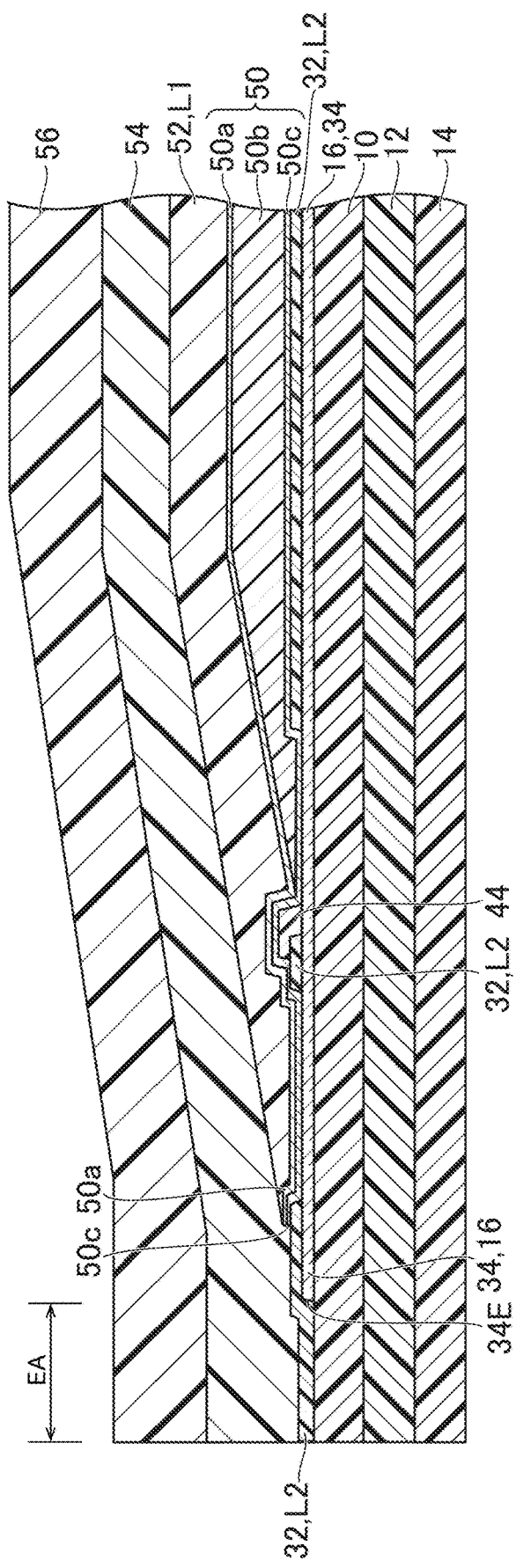
FIG. 4 is a IV-IV line cross-sectional view of the display device in FIG. 1.

There is a sealing layer 50 on the counter electrode 48. The sealing layer 50 may serve to prevent external moisture intrusion into the organic electroluminescence layer 46 formed thereunder, requiring high gas barrier properties. The sealing layer 50 has a laminated structure where an encapsulation organic film 50b intervenes between a pair of encapsulation inorganic films 50a, 50c (such as silicon nitride films) over and under it. The pair of encapsulation inorganic films 50a, 50c overlap with and in contact with each other around the encapsulation organic film 50b (FIG. 4). There may be a silicon oxide film or an amorphous silicon layer between each encapsulation inorganic film 50a, 50c and the encapsulation organic film 50b for improving close-fitting properties. A reinforcement organic film 52 is laminated on the sealing layer 50. A polarization plate 56 is attached to the reinforcement organic film 52 with an adhesive layer 54. The polarization plate 56 may be a circular polarization plate.

Figure 3:
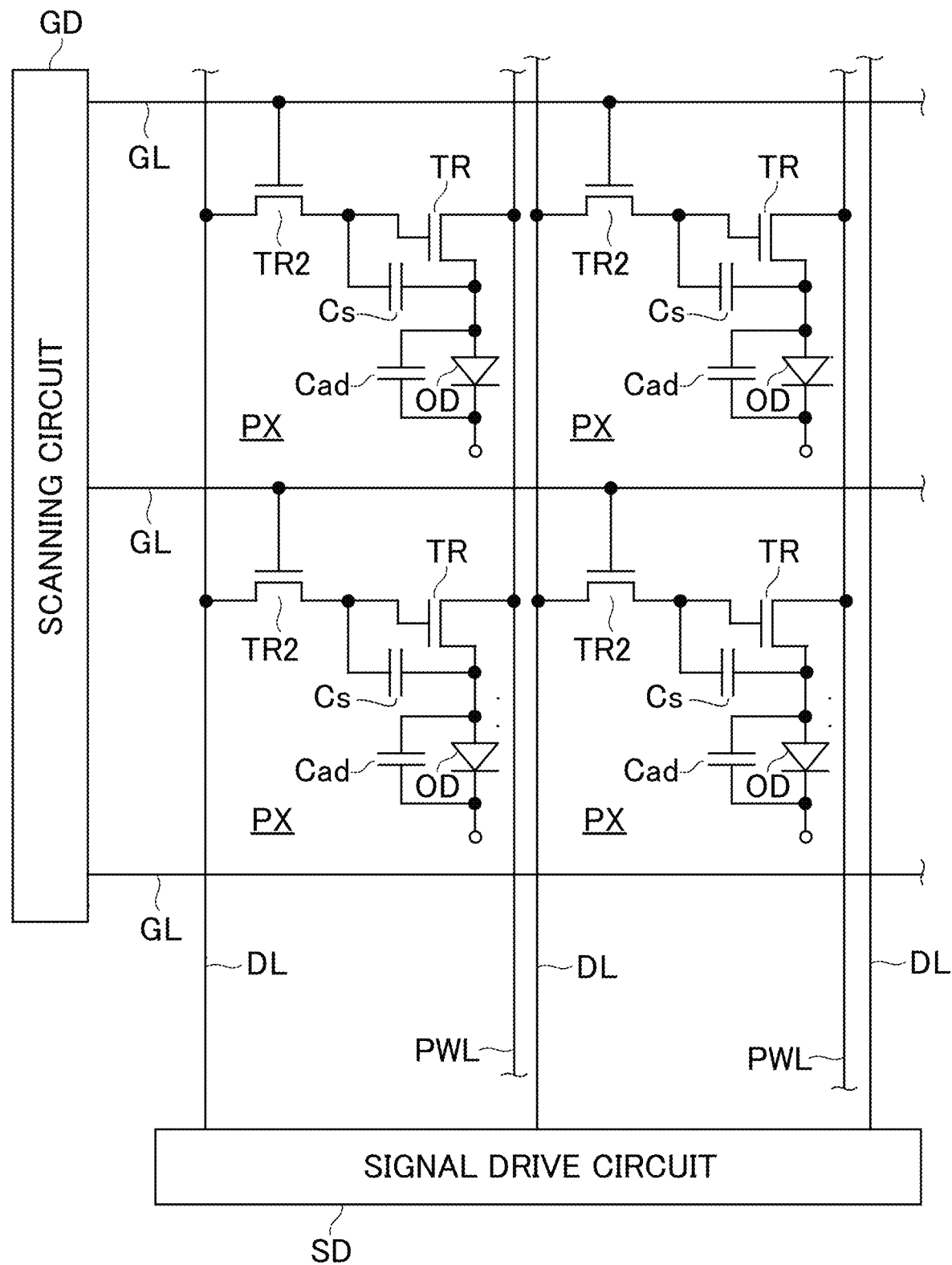
FIG. 3 is a circuit diagram of the display device in FIG. 1.

FIG. 3 is a circuit diagram of the display device in FIG. 1. The circuit includes a plurality of scan lines GL connected to a scanning circuit GD and a plurality of signal lines DL connected to a signal drive circuit SD. The integrated circuit chip CP in FIG. 1 stores the signal drive circuit SD. An area surrounded by adjacent two scan lines GL and adjacent two signal lines DL is one pixel PX. The pixel PX includes the thin film transistor TR for a drive transistor and the thin film transistor TR2 for a switch, the storage capacitor Cs, and the additional capacitance Cad. By applying gate voltage to the scan line GL, the thin film transistor TR2 is turned ON, a video signal is supplied from the signal line DL, and the storage capacitor Cs and the additional capacitance Cad stores charge. By storing the charge in the storage capacitor Cs, the thin film transistor TR is turned ON, and a current flows from a power line PWL to a light-emitting element OD. With the current, the light-emitting element OD emits light.

FIG. 4 is a IV-IV line cross-sectional view of the display device in FIG. 1. There are multiple layers laminated on the resin substrate 10. Each of the multiple layers is an organic film or an inorganic film. The display element layer 30 (FIG. 2) for displaying the images is included in the multiple layers, the sealing layer 50 is also included in the multiple layers, and each of the encapsulation organic film 50b and the encapsulation inorganic films 50a, 50c is one of the multiple layers.

Every inorganic film included in the multiple layers is situated to avoid an edge area EA, which is at least a part of a peripheral portion of the resin substrate 10 (outside the display area DA in FIG. 1), or may avoid the whole peripheral portion. In FIG. 4, the barrier inorganic film 16 is integrally included in the circuit layer 34. The circuit layer 34 in FIG. 4 has an edge 34E adjacent to the edge area EA.

The multiple layers include a first layer L1. The reinforcement organic film 52 is the first layer L1. The first layer L1 (reinforcement organic film 52) is situated to avoid the edge area EA of the resin substrate 10 but entirely covers the display area DA in FIG. 1. The first layer L1 at an edge has an upper surface sloping downward toward the edge area EA outside the display area DA in FIG. 4. The first layer L1 and the pair of encapsulation inorganic films 50a, 50c are aligned at tips. This is because the first layer L1 (reinforcement organic film 52) is used for an etching mask of the pair of encapsulation inorganic films 50a, 50c, and then is left without being removed. The insulation organic film 44 is also formed to avoid the edge area EA.

The multiple layers include a second layer L2. The flattening organic film 32 is the second layer L2. The second layer L2 (the flattening organic film 32) in FIG. 2 is laminated on the circuit layer 34 and discontinuously extends to the edge area EA. The second layer L2 may cover the whole peripheral portion of the resin substrate 10. The second layer L2 and the edge area EA of the resin substrate 10 are aligned at outer edges. The second layer L2 overlaps with the edge of the circuit layer 34. The second layer L2 overlaps with edges of the pair of encapsulation inorganic films 50a, 50c. Depending on the formation order, the edges of the pair of encapsulation inorganic films 50a, 50c are on an edge of the second layer L2. The first layer L1 has an edge on the edges of the pair of encapsulation inorganic films 50a, 50c. That is, the second layer L2 overlaps with the edge of the first layer L1. In the edge area EA of the resin substrate 10, a part of the second layer L2 intervenes between the resin substrate 10 and the adhesive layer 54.

The polarization plate 56 is attached to the first layer L1 and the second layer L2 with the adhesive layer 54. The polarization plate 56 has an edge above the edge area EA of the resin substrate 10. The polarization plate 56 at outer edge is aligned with the edge area EA of the resin substrate 10.

In the embodiment, all of the inorganic films avoid the edge area EA of the resin substrate 10. In the edge area EA, the second layer L2 intervenes between the resin substrate 10 and the adhesive layer 54, reducing unevenness and preventing separation of the polarization plate 56.

Figure 5:
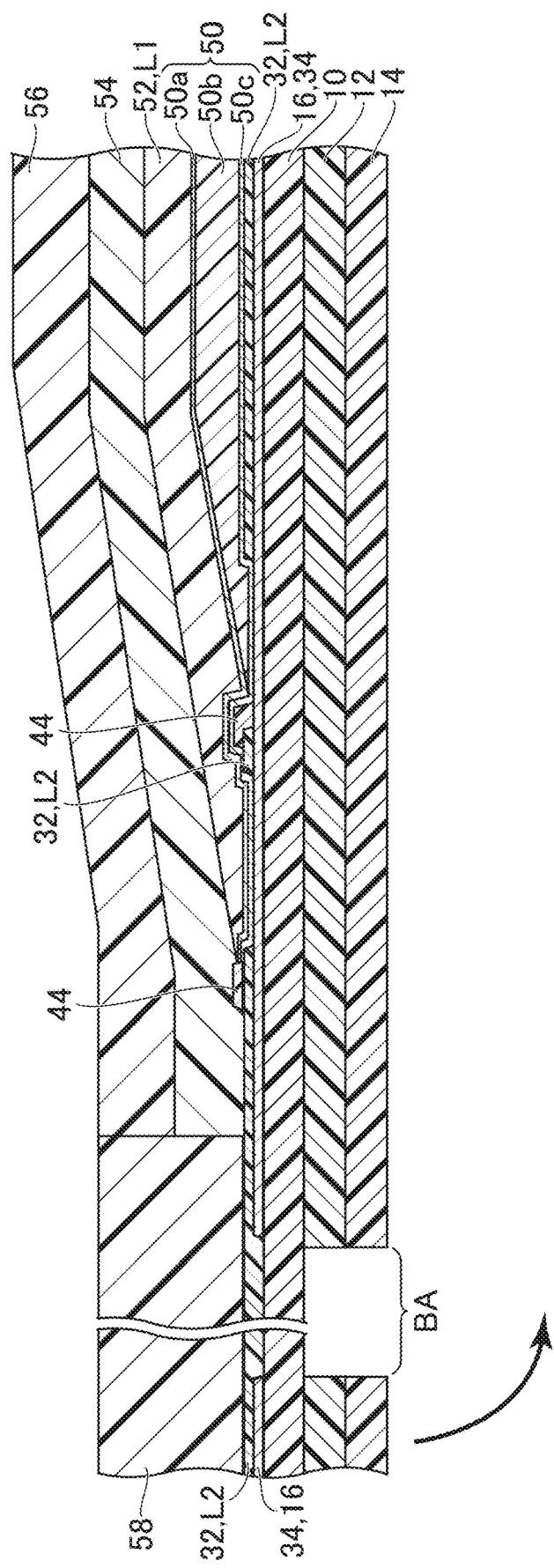
FIG. 5 is a V-V line cross-sectional view of the display device in FIG. 1.
Figure 6:
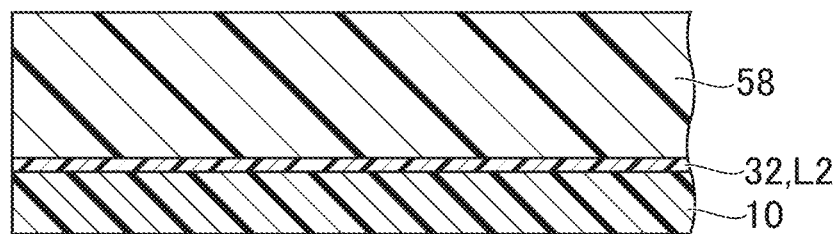
FIG. 6 is a VI-VI line cross-sectional view of the display device in FIG. 1.

FIG. 5 is a V-V line cross-sectional view of the display device in FIG. 1. FIG. 6 is a VI-VI line cross-sectional view of the display device in FIG. 1. The resin substrate 10 has a bending area BA for use in curvature. For the curvature, the bending area BA has no inorganic film. The circuit layer 34 also avoids the bending area BA. The pressure sensitive adhesive 12 and the reinforcement film 14 also avoid the bending area BA. In the bending area BA, without the insulation organic film 44, there is the flattening organic film 32 (the second layer L2). The flattening organic film 32 in the bending area BA is in contact with and laminated on the resin substrate 10. In FIG. 5, the insulation organic film 44 is situated next to the tip of the first layer L1, for stopping flow of materials at the insulation organic film 44 during forming the first layer L1.

In the bending area BA, neither the adhesive layer 54 nor the polarization plate 56 is provided, instead, a soft resin 58 is provided. The soft resin 58 has higher flexibility than other organic films, for preventing the resin substrate 10 from being bent in too large curvature (in a too small curvature radius). The soft resin 58 is in contact with and laminated on the flattening organic film 32. The soft resin 58 is situated to extend beyond the bending area BA and on a part of the first flexible printed circuit board FP1 (shown by a broken line in FIG. 1). The soft resin 58 in FIG. 6 extends to the peripheral portion of the resin substrate 10.

Figure 7:
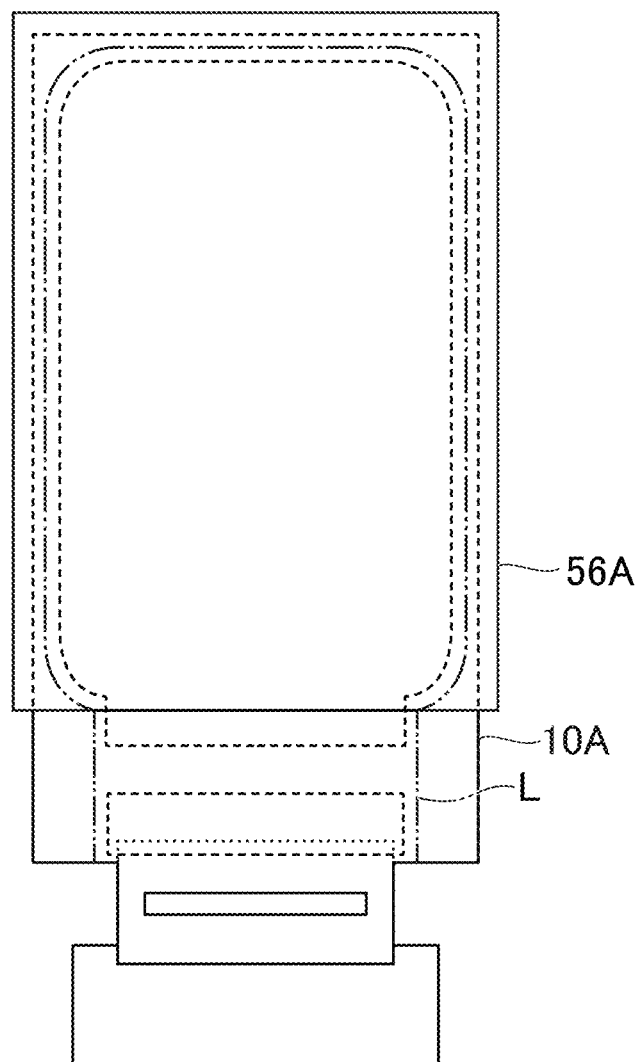
FIG. 7 is an explanatory diagram of a manufacturing method of the display device in the first embodiment.

FIG. 7 is an explanatory diagram of a manufacturing method of the display device in the first embodiment. In manufacturing processes, the resin substrate 10 and the polarization plate 56 are cut out from a resin substrate material 10A and a polarizing plate material 56A, which are larger than the resin substrate 10 and the polarization plate 56. By being cut out from such a large material, the resin substrate 10 and the polarization plate 56 are aligned at edge surfaces, improving position accuracy of the polarization plate 56 and the display area DA.

Specifically, layers up to the first layer L1 in FIG. 2 (including the first layer L1) are laminated on the resin substrate material 10A. For example, inorganic materials are formed and patterned on the resin substrate material 10A, and the circuit layer 34 is formed to include the barrier inorganic film 16. The flattening organic film 32 is formed on it. The pixel electrode 42, the insulation organic film 44, the organic electroluminescence layer 46, and the counter electrode 48 are laminated on it.

Additionally, the sealing layer 50 is formed. In FIG. 4, to stop flow of organic material for forming the encapsulation organic film 50b, a dam is formed from a part of the insulation organic film 44. Forming the pair of encapsulation inorganic films 50a, 50c includes an etching process in which the first layer L1 formed thereon is used as an etching mask. As shown in FIG. 5, the dam, for forming the first layer L1 to stop the flow of the organic material, may be formed from a part of the insulation organic film 44.

Then, the polarizing plate material 56A in FIG. 7 is attached to the first layer L1 and the second layer L2, with the adhesive layer 54. In FIG. 4, with the second layer L2 outside the circuit layer 34, unevenness between them is made smaller. In other words, in spite of the unevenness between the resin substrate 10 and the circuit layer 34 and next to the edge 34E of the circuit layer 34, the unevenness is eased by the second layer L2. Bubbles under the adhesive layer 54 are less likely to be formed. Then, the laminate including the resin substrate material 10A and the polarizing plate material 56A is cut along a cutline L in FIG. 7. A laser may be used for cutting.

Second Embodiment

Figure 8:
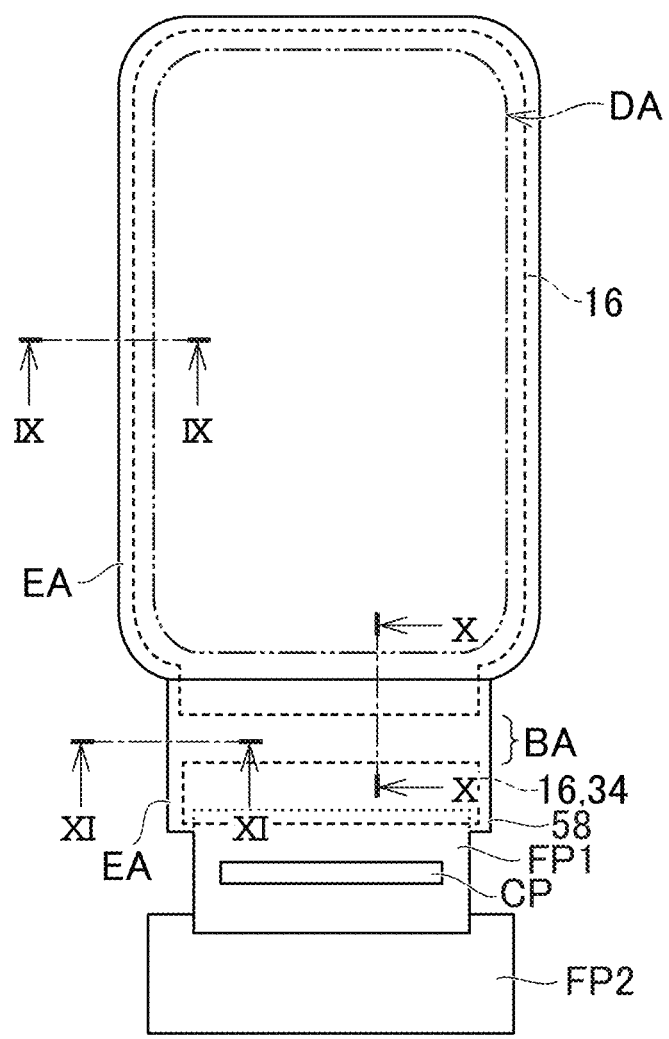
FIG. 8 is a plan view of a display device in a second embodiment.
Figure 9:
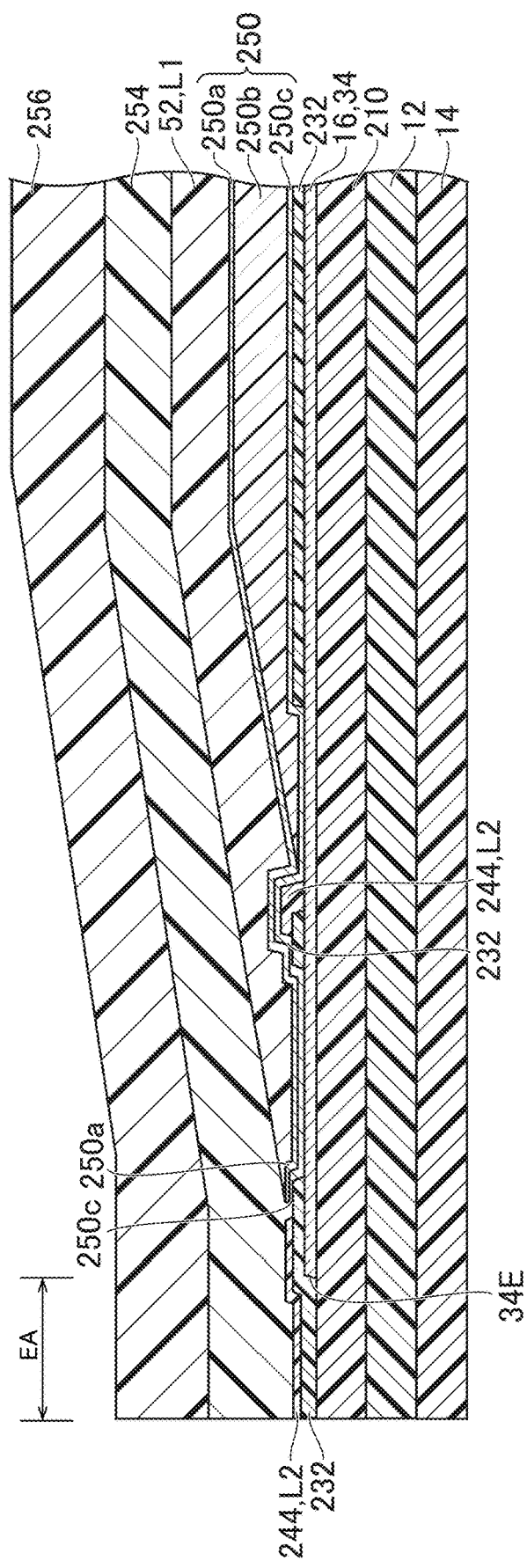
FIG. 9 is a IX-IX line cross-sectional view of the display device in FIG. 8.

FIG. 8 is a plan view of a display device in a second embodiment. FIG. 9 is a IX-IX line cross-sectional view of the display device in FIG. 8. FIG. 8 is a developed view before the display device is folded.

In the embodiment, an insulation organic film 244 is the second layer L2. The insulation organic film 244 has a portion at the edge area EA and between a resin substrate 210 and an adhesive layer 254, and has a polarization plate 256 attached thereto with the adhesive layer 254. There is a flattening organic film 232 under the insulation organic film 244 at the edge area EA. The flattening organic film 232 is also laminated on the circuit layer 34 (FIG. 2) and discontinuously extends to the edge area EA.

The second layer L2 (the insulation organic film 244) does not overlap with edges of a pair of encapsulation inorganic films 250a, 250c, but the flattening organic film 232 overlaps with the edges of the pair of encapsulation inorganic films 250a, 250c. There is a crevice between the pair of encapsulation inorganic films 250a, 250c and the second layer L2. The flattening organic film 232 is in contact with the adhesive layer 254 in the crevice.

Figure 10:
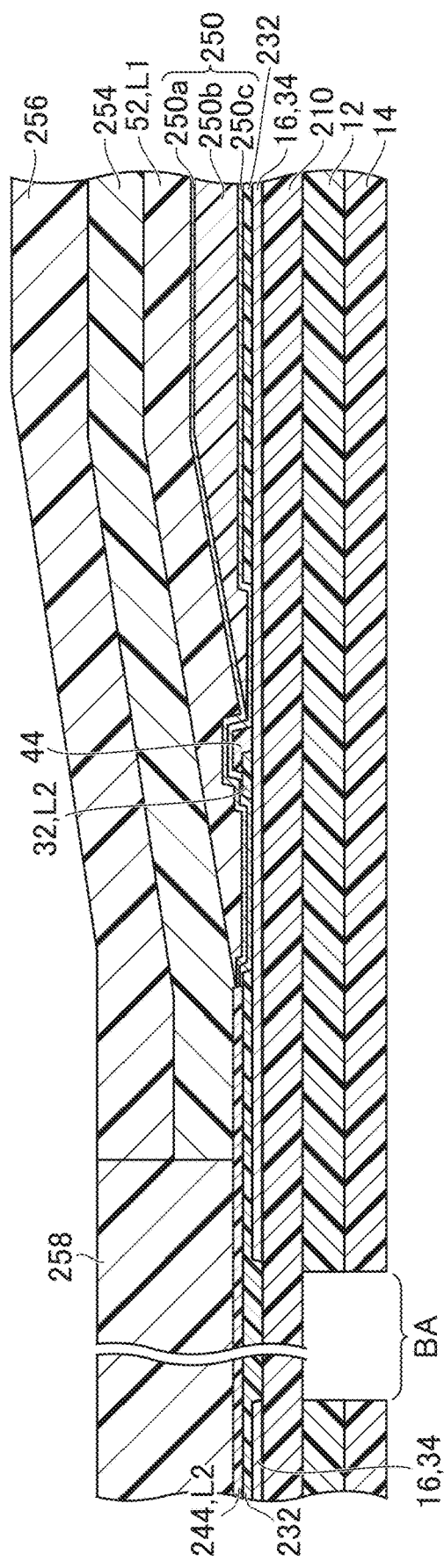
FIG. 10 is a X-X line cross-sectional view of the display device in FIG. 8.
Figure 11:
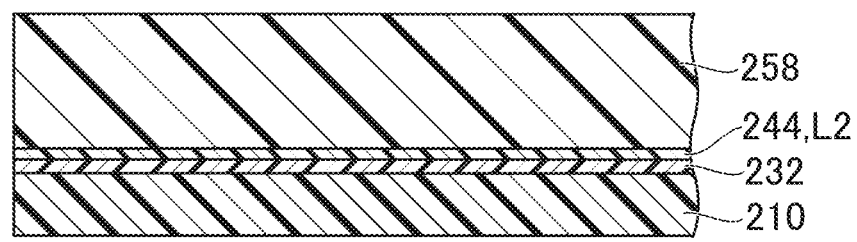
FIG. 11 is a XI-XI line cross-sectional view of the display device in FIG. 8.

FIG. 10 is a X-X line cross-sectional view of the display device in FIG. 8. FIG. 11 is a XI-XI line cross-sectional view of the display device in FIG. 8. In the bending area BA, in addition to the flattening organic film 232, the insulation organic film 244 (the second layer L2) is also provided. A soft resin 258 is in contact with and laminated on the insulation organic film 244. What is explained in the first embodiment is applicable to other matters in this embodiment. There is unevenness next to the edge 34E of the circuit layer 34 and between the resin substrate 210 and the circuit layer 34, but the unevenness is eased by the second layer L2.

Third Embodiment

Figure 12:
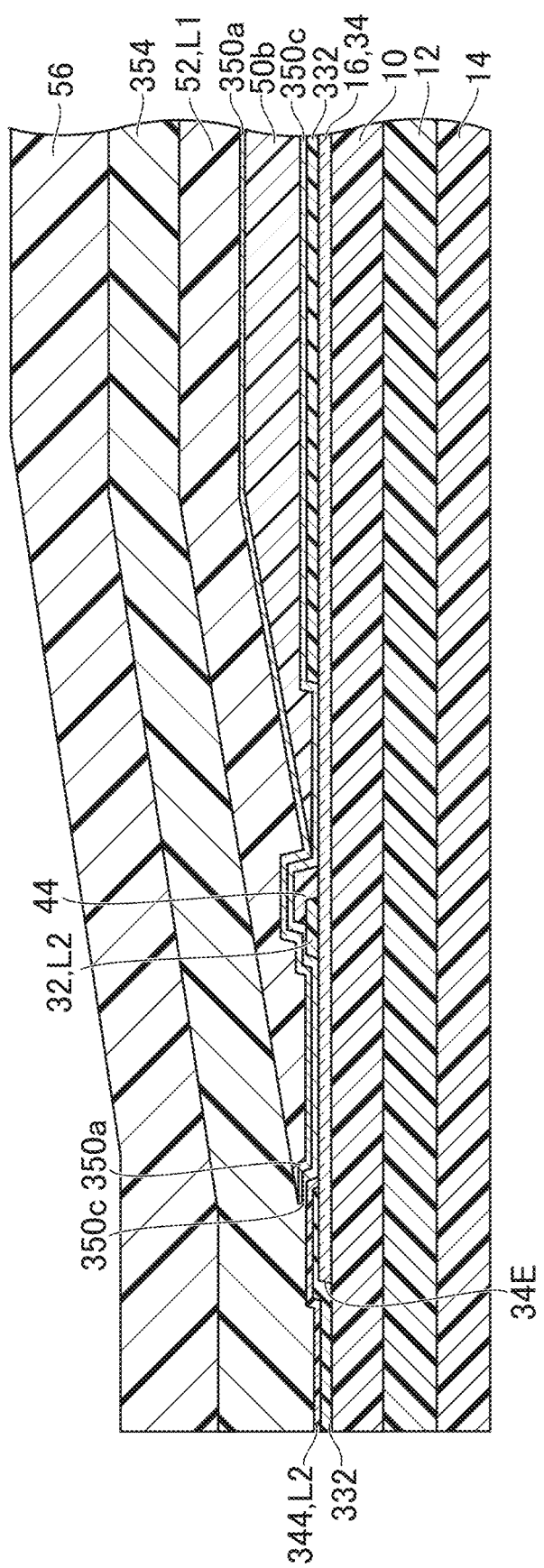
FIG. 12 is a cross-sectional view of a display device in a third embodiment.

FIG. 12 is a cross-sectional view of a display device in a third embodiment. This embodiment is different from the second embodiment in that the second layer L2 (insulation organic film 344) overlaps with edges of a pair of encapsulation inorganic films 350a, 350c. Additionally, an adhesive layer 354 is in contact with an insulation organic film 344 but in no contact with a flattening organic film 332. What is explained in the first embodiment is applicable to other matters in this embodiment.

Fourth Embodiment

Figure 13:
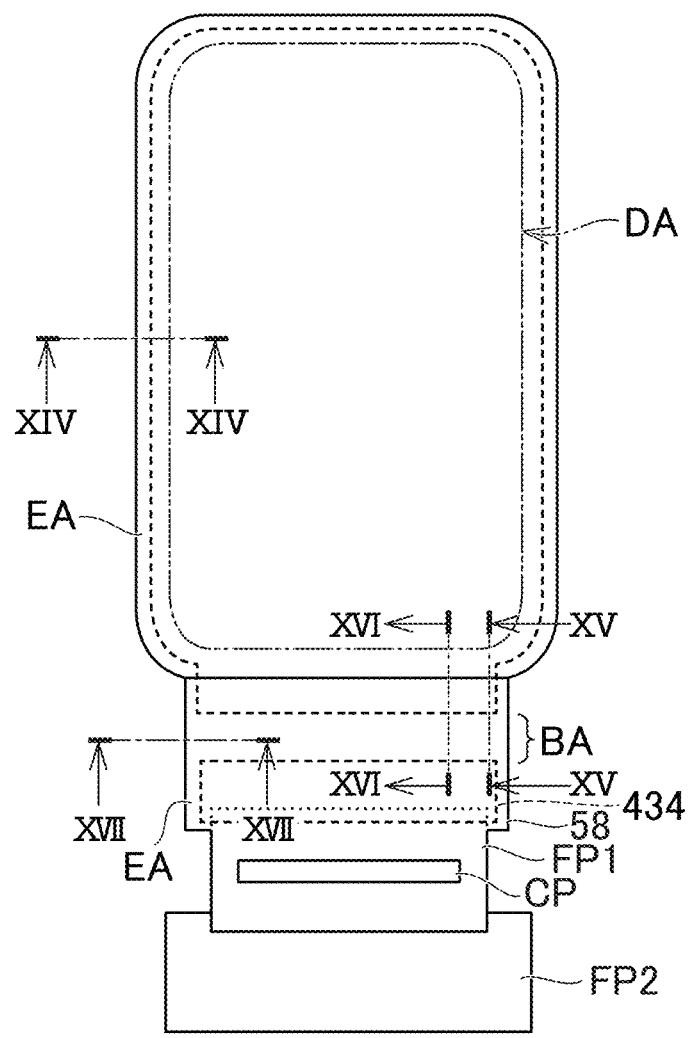
FIG. 13 is a plan view of a display device in a fourth embodiment.
Figure 14:
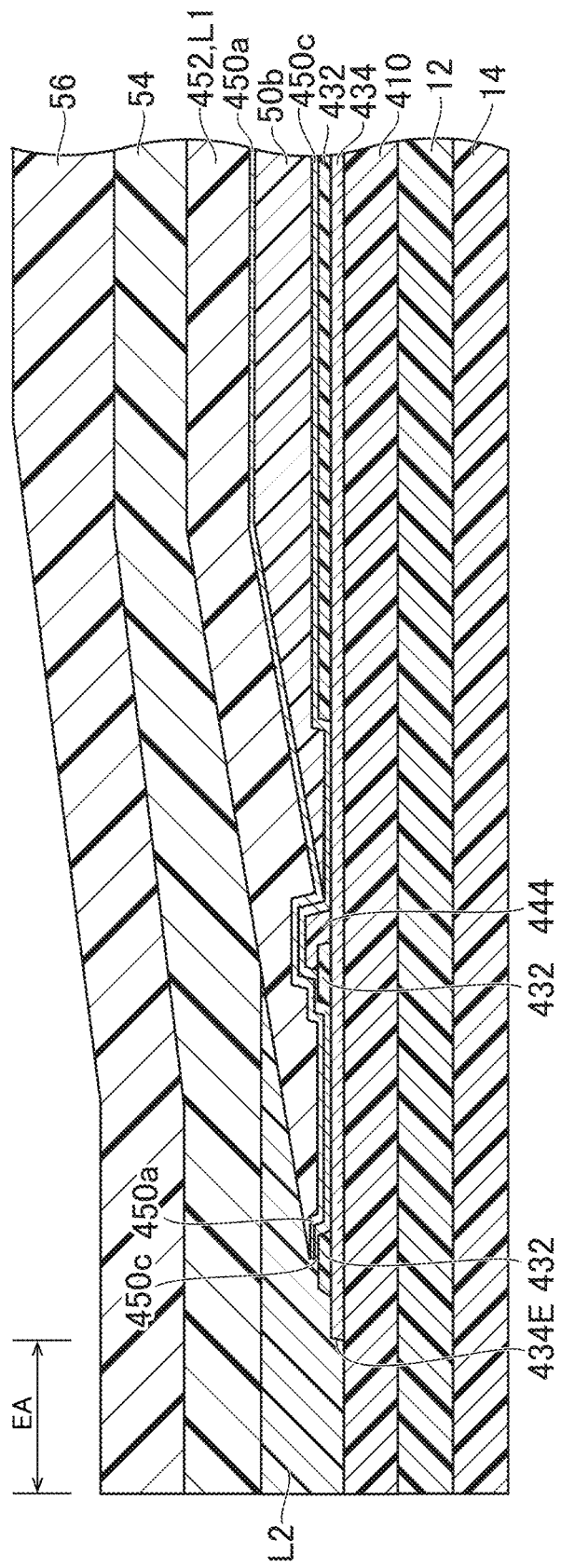
FIG. 14 is a XIV-XIV line cross-sectional view of the display device in FIG. 13.

FIG. 13 is a plan view of a display device in a fourth embodiment. FIG. 14 is a XIV-XIV line cross-sectional view of the display device in FIG. 13. FIG. 13 is a developed view before the display device is folded.

In the embodiment, the second layer L2 is situated in the edge area EA of a resin substrate 410 to avoid the display area DA. That is, the second layer L2 is an organic film provided to be different from a laminate structure in the display area DA. The second layer L2 can be formed by inkjet. The second layer L2 is adjacent to the edge area EA and on a circuit layer 434. The second layer L2 is on a flattening organic film 432 on the circuit layer 434, and on a pair of encapsulation inorganic films 450a, 450c on the flattening organic film 432. Additionally, the second layer L2 is on an edge of the first layer L1 (reinforcement organic film 452). Neither the flattening organic film 432 nor the insulation organic film 444 is provided at a peripheral portion of the resin substrate 410 (left edge in FIG. 17).

Figure 15:
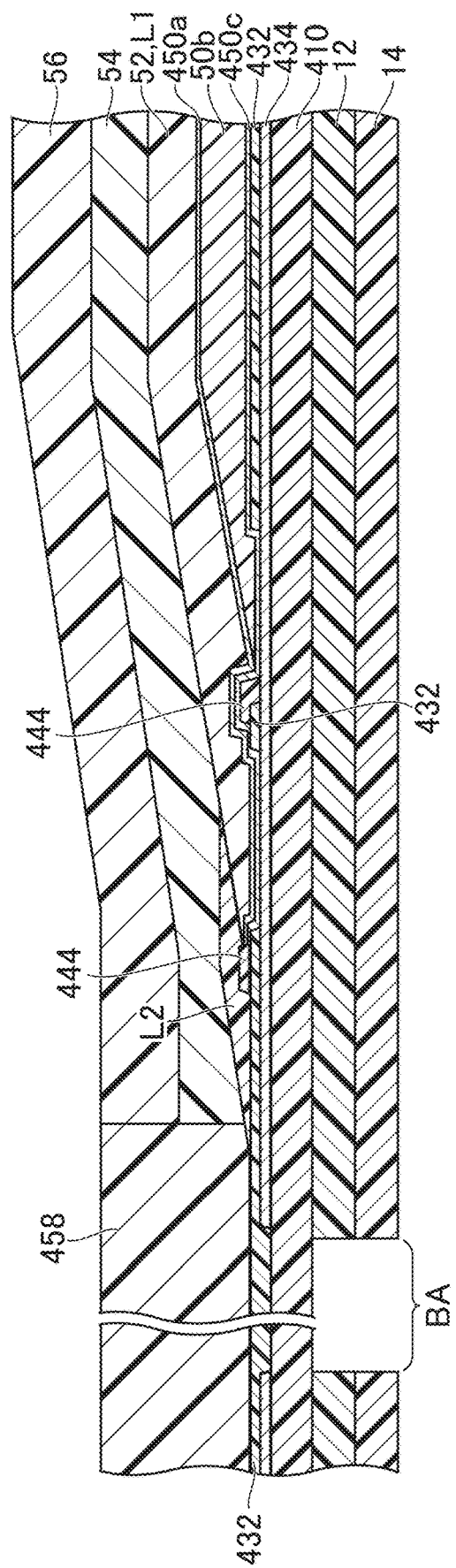
FIG. 15 is a XV-XV line cross-sectional view of the display device in FIG. 13.
Figure 16:
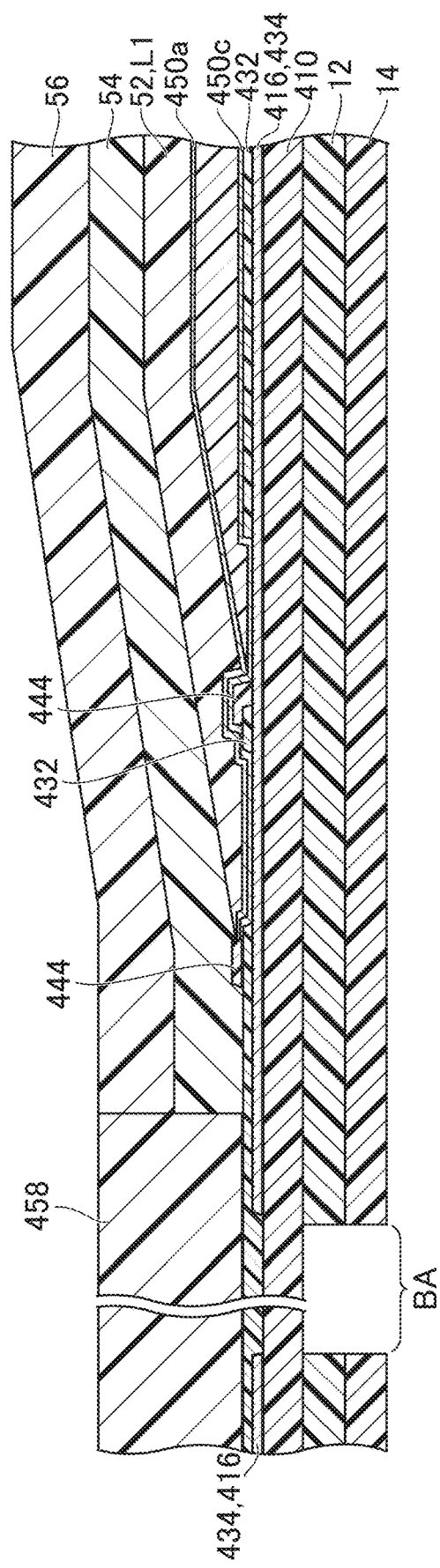
FIG. 16 is a XVI-XVI line cross-sectional view of the display device in FIG. 13.

FIG. 15 is a XV-XV line cross-sectional view of the display device in FIG. 13. FIG. 16 is a XVI-XVI line cross-sectional view of the display device in FIG. 13. In FIG. 15, the second layer L2 does not extend to the bending area BA of the resin substrate 410. By contrast, a soft resin 458 extends in a direction from the bending area BA to the display area DA, slightly overlaps with the second layer L2, without overlapping with the display area DA. The second layer L2 has an upper surface sloping downward toward a tip overlapping with the soft resin 458. The second layer L2 is on an edge of the circuit layer 434, in an area next to a peripheral portion of the resin substrate 410 (FIG. 14) and in an area next to the bending area BA (FIG. 15). By contrast, in FIG. 16, the second layer L2 is not formed in an area away from the peripheral portion of the resin substrate 410. The second layer L2 continuously surrounds the display area DA, on three sides (upper side, left and right sides in FIG. 13) in three directions which are perpendicular to adjacent each other, of four directions surrounding the display area DA, and the second layer L2 is discontinuous on the remaining one side (lower side in FIG. 13).

Figure 17:
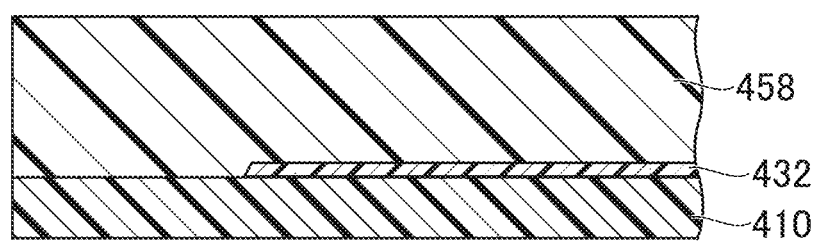
FIG. 17 is a XVII-XVII line cross-sectional view of the display device in FIG. 13.

FIG. 17 is a XVII-XVII line cross-sectional view of the display device in FIG. 13. The peripheral portion (left edge in FIG. 17) of the resin substrate 410 has an area where the second layer L2 is not provided. The second layer L2 is disposed to avoid the bending area BA of the resin substrate 410. In the bending area BA, the flattening organic film 432 is provided to avoid the peripheral portion of the resin substrate 410. What is explained in the first embodiment is applicable to other matters in this embodiment. There is unevenness adjacent to the edge 434E of the circuit layer 434 and between the resin substrate 410 and the circuit layer 434, but the unevenness is eased due to satisfactory thickness secured in the second layer L2.

The display device is not limited to the organic electroluminescence display device but may be a display device with a light-emitting element such as a quantum-dot light emitting diode (QLED) disposed in each pixel.

While there have been described what are at present considered to be certain embodiments, it will be understood that various modifications may be made thereto, and it is intended that the appended claims cover all such modifications as fall within the true spirit and scope of the invention.

What is claimed is:

1. A display device comprising:
   a resin substrate;
   a barrier inorganic film above the resin substrate;
   a circuit layer above the barrier inorganic film;
   an organic film above the circuit layer;
   a display element layer including a plurality of pixels above the organic film;
   a sealing layer covering the display element layer; and
   a polarization plate having an adhesive layer disposed above the sealing layer,
   wherein
   the display device has a display area and an edge area located outside of the display area in a plan view,
   the sealing layer has an encapsulation organic film and a pair of encapsulation inorganic films that interpose the encapsulation organic film,
   the pair of encapsulation inorganic films has a lower encapsulation inorganic film and an upper encapsulation inorganic film,
   the barrier inorganic film and the pair of the pair of encapsulation inorganic films are arranged except on the edge area,
   the organic film is arranged between the resin substrate and the adhesive layer, in the edge area,
   the lower encapsulation inorganic film and the upper encapsulation inorganic film are in direct contact with each other outside of the encapsulation organic film, and
   the lower encapsulation inorganic film is in direct contact with the barrier inorganic film or the circuit layer outside of the encapsulation organic film.

2. The display device according to claim 1, further comprising
   a reinforcement organic film arranged above the sealing layer, the reinforcing organic film having an upper surface sloping downward toward the edge area.

3. The display device according to claim 2, wherein the reinforcement organic film and the pair of encapsulation inorganic films are aligned at tips.

4. The display device according to claim 1, wherein the organic film overlaps with an edge of the barrier inorganic film.

5. The display device according to claim 1, wherein the organic film discontinuously extends to the edge area.

6. The display device according to claim 1, wherein the display element layer includes a pixel electrode, a counter electrode, and an organic electroluminescence layer between the pixel electrode and the counter electrode.

7. The display device according to claim 1, wherein the organic film overlaps with edges of the pair of encapsulation inorganic films.

8. The display device according to claim 1, wherein the organic film and the edge area are aligned at outer edges.

* * * * *